(12) United States Patent
Nice (10) Patent No.: US 6,497,765 B1
(45) Date of Patent: Dec. 24, 2002

(54) MULTI PIECE SWIVEL CHUCK FOR HOLDING CONICAL SHAPED WORK

(75) Inventor: Travis S. Nice, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 12 days.

(21) Appl. No.: 09/589,467

(22) Filed: Jun. 7, 2000

(51) Int. Cl.[7] .............................................. C30B 15/30
(52) U.S. Cl. ............................. 117/200; 279/6; 279/16; 279/19.6; 279/20; 279/135; 451/385; 451/379; 451/398
(58) Field of Search ................................ 117/200; 29/6, 29/19.6, 20, 135; 451/385, 379, 398

(56) References Cited

U.S. PATENT DOCUMENTS

| | | | | |
|---|---|---|---|---|
| 3,779,619 A | * | 12/1973 | Van Dorn et al. ............. | 308/72 |
| 4,082,531 A | * | 4/1978 | Kolleck ........................ | 65/296 |
| 4,946,178 A | * | 8/1990 | Korson et al. ................. | 279/35 |
| 5,464,231 A | * | 11/1995 | Clay ........................... | 279/123 |
| 5,525,092 A | | 6/1996 | Hirano et al. | |
| 5,752,706 A | * | 5/1998 | Hodges ........................ | 279/16 |
| 6,012,976 A | | 6/2000 | Aydelott et al. | |

* cited by examiner

Primary Examiner—Robert Kunemund
(74) Attorney, Agent, or Firm—Alston & Bird LLP (57) ABSTRACT

An improved chuck for supporting elongated work pieces having conical end portions, such as single crystal ingots used to fabricate semiconductor wafers, while such. The chuck is typically used in a lathe for positioning and allowing rotation of the work piece during a grinding procedure that results in optimal work piece diameter. The chuck comprises a ring-shaped base, or socket, having a cavity defining a central axis therethrough and a series of fastener holes for securing the base to a headstock or tailstock of a lathe. The base receives within the cavity a portion of a chuck insert. The chuck insert defines a work piece support surface that is coaxial with the central axis when the chuck insert is disposed in a nominal position within the cavity of the base. The work piece support surface will typically define a continuous, arcuate, convex surface capable of supporting work pieces having conical end portions of varying diameters. The chuck also includes a retainer that is adapted to surround and support at least a portion of the chuck insert. The retainer allows the chuck insert to pivot from the nominal position to a predetermined angle relative to the central axis when the conical end of the work piece is loaded into the chuck so as to align the work piece within the lathe. The pivoting nature of the chuck of the present invention allows for proper alignment of the work piece in the lathe by overcoming the frictional forces that exist between the work piece and the support surface.

20 Claims, 6 Drawing Sheets

MULTI PIECE SWIVEL CHUCK FOR HOLDING CONICAL SHAPED WORK

FIELD OF THE INVENTION

The present invention relates generally to machines for shaping single crystal ingots, and, more particularly to a swivel chuck for holding a conical end of such an ingot while the ingot is being rotated and machined for a desired shape.

BACKGROUND OF THE INVENTION

Semiconductor substrates that are used to fabricate semiconductor integrated circuits are typically manufactured from single crystal ingots, or boule. These ingots are commonly grown by a standard melt crystal growth technique, such as the Czochralski (CZ) method. In the CZ method a cylindrical single crystal is pulled vertically from silicon melt in a heated crucible. The growth is initiated by dipping a small seed crystal in the melt, and after the thermal equilibrium is reached, the crystal is pulled upwards so that it grows with a constant diameter. At the same time, the crystal rod and the crucible are rotated in opposite directions. This process results in a single crystal ingot that is has a generally constant radius, uniform dopant and impurity distribution, low number of defects, and continuous Czochralski growth.

Once the single crystal ingot is formed further processing is necessary to shape the cylindrical structure into a prescribed diameter. This processing typically involves centering the single ingot crystal in a shaping device, such as a lathe, and then grinding the ingot to the prescribed diameter dimension. Once the ingot has been properly ground to the required diameter, the ingot is then sliced perpendicular to the longitudinal axis to obtain generally planar wafers. The resulting wafers are then further processed to form a multitude of individual integrated circuits.

The single crystal ingots resulting from the CZ method have generally conical ends. These ends are centered in the lathe, using a chuck located at each end thereof to grip the generally conical ends so that the ingot can be ground to a prescribed diameter. Current lathes employ chucks defining concave socket surfaces that are positioned at opposite ends of the lathe (referred to in the art as the headstock and tailstock of the lathe) to hold the conical ends of the single crystal ingot.

The crystal growth process results in the generally conical shaped ends having somewhat irregular shaped surfaces that typically exhibit protruding nodes or other surface anomalies. The end portions of the ingots thus contact the interior surfaces of the conical socket portion of the lathe chuck with irregular concentrated pressure points that are related to the geometric characteristics of the conical ends of the ingot. Axial pressure is exerted between the tailstock and the headstock of the lathe in supporting and rotating the single crystal ingot and such pressure brings the surfaces of the conical ends of the ingot against the surfaces of the chucks used to hold such an ingot in a lathe. Pressure concentrations caused by nodes in the conical end portions of the ingot are thus imposed on the surfaces of such chucks. For a more detailed discussion of the axial pressure exerted during the lathe process see U.S. Pat. No. 5,525,092, entitled "Device for Preventing Idle Rotation in Cylindrical Ingot Grinder", issued Jun. 11, 1996, in the name of inventors Hirano et al.

Most previously known chucks are of unitary construction and have axially oriented fastener holes that intersect the conical interior socket surfaces. These fastener holes are used to receive fasteners, such as bolts, which connect the chucks to the base of the lathe. In application, an ingot held in such a chuck will typically slip until a node on its surface engages a fastener hole and interlocks with it. While this stops the ingot from further slippage, it often results in the ingot being located skewed from the desired concentric axis of the lathe. Further problems are encountered with these chucks during the machining process, as the ingot is prone to slip into different positions due to the movement of the lathe.

Additionally, because of the previously mentioned irregular surfaces of the conical end portions of the ingot, the surfaces of the interior of the conical chucks are susceptible to damage. This surface damage is especially prevalent at the seat of the holes through which the fasteners are inserted to connect the chucks to the headstock/tailstock of the lathe. The deformation of the material surrounding the holes causes these areas to more likely engage nodes on the ends of ingots, thus impeding accurate placement of the ingot in the chuck. Damaged and/or deformed chucks require replacement and thus bring about unwarranted hardware expenditures, which drive up the cost of wafer production. Additionally, the replacement of such chucks is a time consuming endeavor that requires precise centering on the lathe to mitigate unacceptable vibration in the ingot during the grind process.

To alleviate these problems in most lathe assemblies it is necessary to center the conical ends of the ingots and to securely grip them so that the ingots can be rotated during the grinding operation without excessive slippage. This insures that the ingots can be shaped accurately into the required generally cylindrical shape in preparation for being subsequently sliced into wafers. Using the conventional chucks described above it has been difficult to both center an ingot accurately and to hold the ingot securely enough to rotate it in a controlled manner so that it can be shaped as required without hastening damage to the chuck surfaces that contact the ingot.

An improved chuck device has been developed that utilizes multiple pieces to eliminate the likelihood of fastener holes engaging the nodes on the conical end of the ingot and to minimize replacement and downtime losses related to damaged chucks. See for example, U.S. Pat. No. 6,012,976, entitled "Multi-Piece Lathe Chuck for Silicon Ingots," issued Jan. 11, 2000, in the name of inventors Aydelott et. al. The multiple piece chuck has a base portion that receives fasteners for attachment to the headstock or tailstock of the lathe. A receptacle within the base portion holds an annular chuck insert which has a conical socket surface to engage the conical end portion of the ingot. Setscrews are provided within the base portion and serve to retain the chuck insert in the receptacle portion of the base. This configuration allows for the interior surface of the chuck insert to be continuous and, thus devoid of any fastener holes that are susceptible to engaging nodes on the ingot. Additionally, the dual portion aspect of the chuck allows the chuck insert to be readily replaced without the need to replace the entire chuck.

However, recently developed chucks do not account for the high degree of friction that results between the chuck and the single crystal ingot. If the ingot is not perfectly centered during the initial loading of the ingot into the chuck, the friction between the ingot and chuck prevents the ingot from properly sliding into the proper center position. This problem can not be addressed by increasing the clamping force on the crystal, as the delicate nature of the ingot would lead to cracks in the crystals if the force on the crystal were increased.

What is desired is an improved chuck for holding a conical end of an object, such as a single ingot crystal formed of a semiconductor material. The chuck should be capable of properly securing the object in a centered position and to allow for ample transferring of forces to the object to rotate it as it is machined or otherwise shaped as required. The desired chuck should be able to compensate for eccentric loading of the crystal into the chuck. Additionally, the chuck should provide for a continuous mating surface that does not provide for fastener holes that are otherwise engaged by the irregular surfaces of the conical end of the object. As an added benefit, the chuck should be configured so as minimize cost and downtime related to replacing damaged or exhausted chucks.

SUMMARY OF THE INVENTION

The present invention provides for an improved chuck for supporting elongated work objects having conical end portions, such as single crystal ingots used to fabricate semiconductor wafers. The chuck is typically used in a lathe for positioning and allowing rotation of the work piece during a grinding procedure that results in optimal work piece diameter.

The chuck comprises a ring-shaped base, or socket, having a cavity defining a central axis therethrough and a series of fastener holes for securing the base to a headstock or tailstock of a lathe. The base receives within the cavity a portion of a chuck insert. The chuck insert defines a work piece support surface that is coaxial with the central axis when the chuck insert is disposed in a nominal position within the cavity of the base. The work piece support surface will typically define a continuous, arcuate, convex surface capable of supporting work pieces having conical end portions of varying diameters. The continuous, uninterrupted support surface allows for the conical shaped end portions to contact the chuck insert without protruding nodes, or other anomalies, in the work piece engaging fastener bores, or other indentations in the support surface. The arcuate, convex nature of the support surface allows for the chuck to receive conical end portions of varying diameters without the need to change the chuck insert to accommodate the variance in shape of the work piece. Additionally, the arcuate surface minimizes the contact area between the work piece and the chuck so that nodules or other anomalies on the surface of the conical end portions are less likely to interfere and cause the work piece to align improperly within the lathe.

The chuck also includes a retainer that is adapted to surround and support at least a portion of the chuck insert. In a typical embodiment of the invention the retainer will comprise a two-piece unit that assembles to form a continuous ring-like structure around the periphery of the chuck insert. The two-piece embodiment allows for the retainer to be easily removed from the chuck, thus allowing for the chuck inserts to be readily replaced if they become damaged or exhausted. Additionally, the retainer allows the chuck insert to pivot from the nominal position to a predetermined angle relative to the central axis when the conical end of the work piece is loaded into the chuck so as to align the work piece within the lathe. The pivoting nature of the chuck of the present invention allows for proper alignment of the work piece in the lathe. The pivoting action allows the chuck to overcome the frictional forces that exist between the work piece and the support surface during the initial work piece loading process.

Additionally, the chuck of the present invention may comprise a seal that is disposed between the underside of a lip in the chuck insert and the retainer. The seal will typically occupy a groove in the lip of the chuck insert and provide a pivot gap for the chuck insert so that it can pivot a predetermined degree in relation to the central axis. The chuck may also comprise insert pins that are disposed within the chuck insert. Typically, two insert pins will be disposed 180 degrees opposite one another on the exterior surface of the chuck insert. The insert pins will then engage insert slots within the retainer. The insert pins allow for the chuck insert to pivot in a back and forth motion while prohibiting the chuck insert from rotating about the central axis.

As such, the present invention provides for an improved chuck that is capable of pivoting to allow for work pieces to be loaded into the chuck and properly aligned within a lathe. Additionally, the chuck of the present invention provides for a continuous support surface that further aids proper alignment by eliminating the possibility of nodes on the surface of the work piece engaging holes and impeding the proper alignment position. The improved chuck also is designed so as to accommodate ease in chuck insert replacement, thereby limiting lathe downtime and making for a more efficient process.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
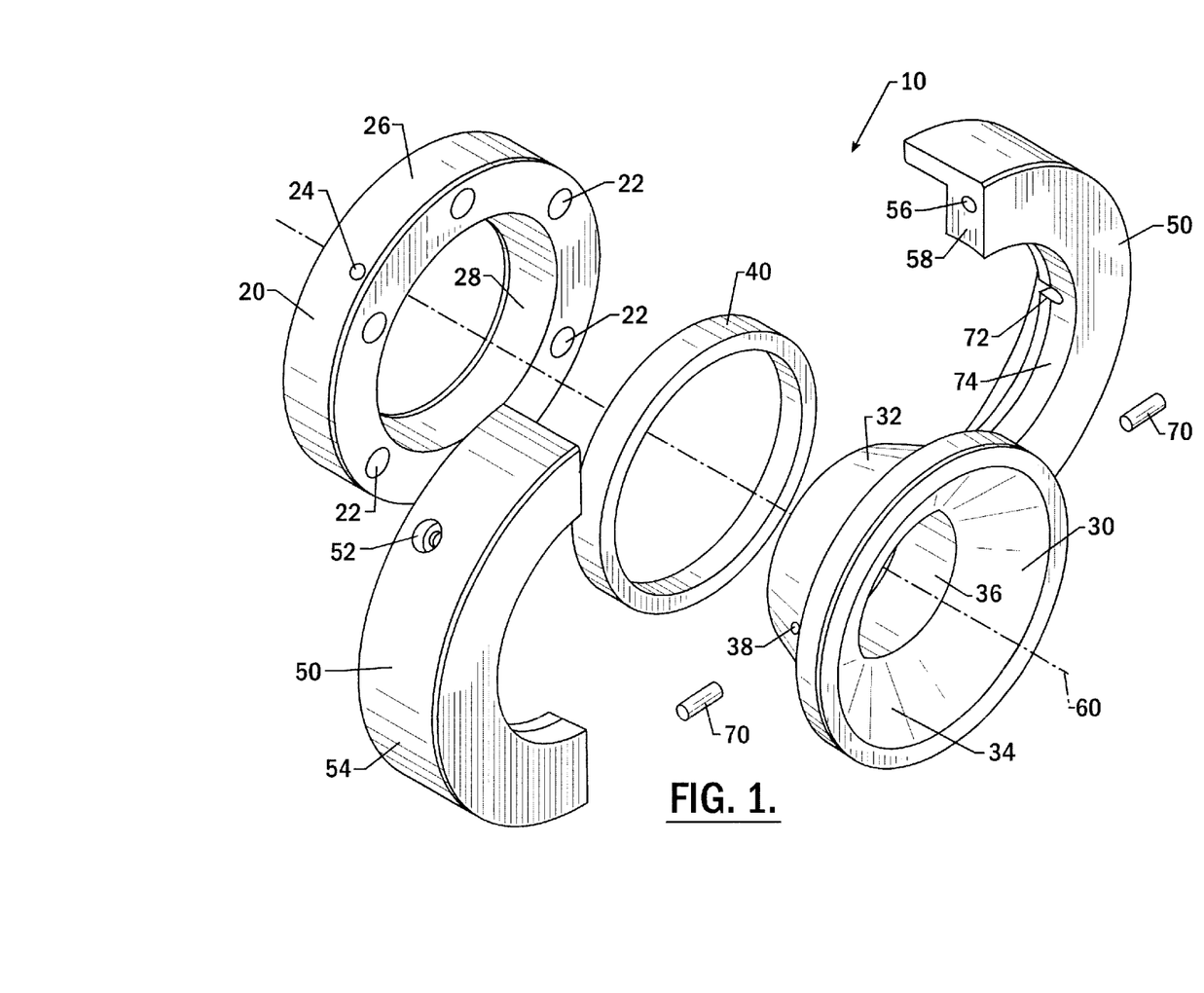
FIG. 1 is an exploded perspective view of the components of a multi-piece swivel chuck in accordance with an embodiment of the present invention.
Figure 2A:
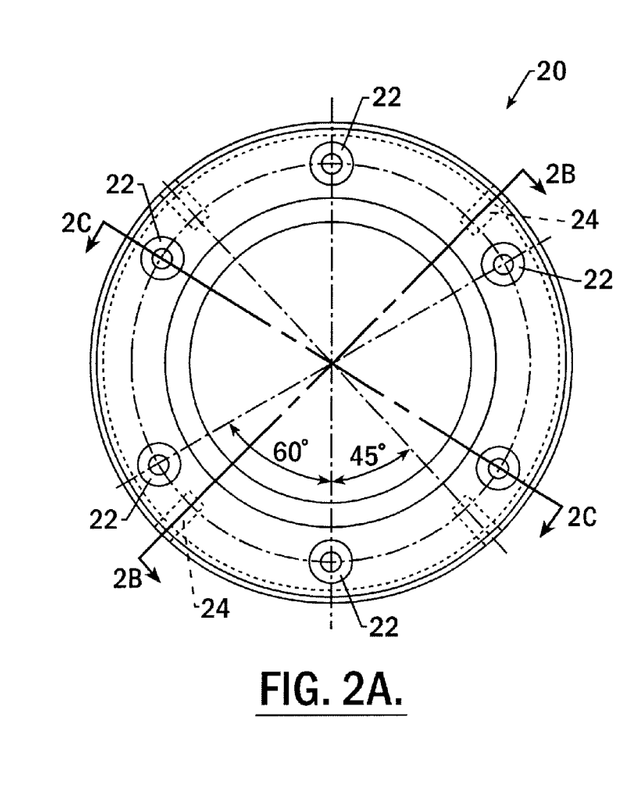
FIGS. 2A–2C are plan and cross-sectional views of the base of the multi-piece swivel chuck, in accordance with an embodiment of the present invention.
Figure 2B:
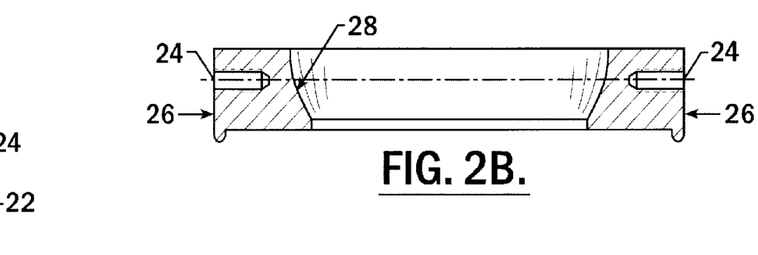
Figure 2C:
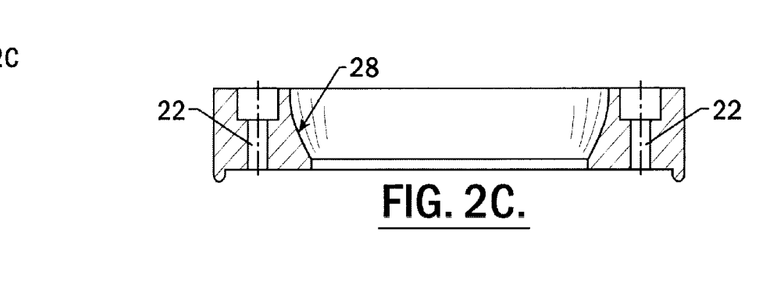

FIG. 1 is a perspective view of the elements that comprise a multi-piece swivel chuck 10 in accordance with an embodiment of the present invention. The chuck includes a base 20, a chuck insert 30, an optional seal 40 and a retainer 50. As depicted in the perspective view of FIG. 1 and the plan and cross-sectional views of FIGS. 2A–2C, the base 20 is typically a ring shaped piece cast or machined of a suitably hard and tough metal, such as steel or aluminum. The base serves as the socket in a ball and socket joint relationship with the chuck insert 30. The base defines fastener holes 22 that extend parallel with the central axis 60 of the chuck 10. The central axis is coincident with the axis of rotation of the lathe. Fastener holes 22 are suited to receive fasteners, typically bolts (not shown in FIG. 1) that serve to attach the base to a drive plate of the lathe (not shown in FIG. 1). Base 20 also defines retainer holes 24 that are located on the outer surface 26 of the base for the purpose of receiving fasteners, typically bolts (not shown in FIG. 1) that serve to attach the base to the retainer(s) 50. The inner surface 28 of the base is shaped so as to securely mate with the exterior surface 32 of the chuck insert 30. In the embodiment shown in FIGS. 2B and 2C the inner surface is generally cup-shaped, suited to receive a similarly shaped chuck insert.

Figure 3A:
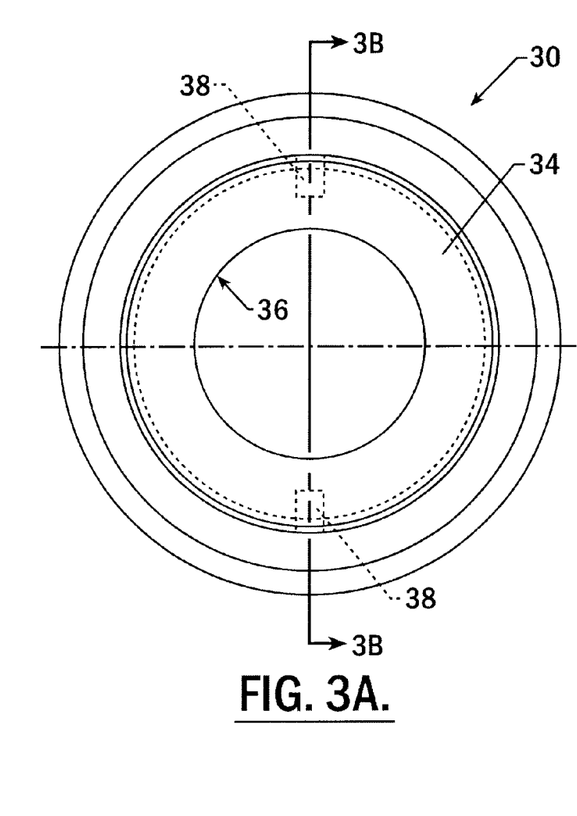
FIGS. 3A and 3B are plan and cross-sectional views of the chuck insert of the multi-piece swivel chuck, in accordance with an embodiment of the present invention.
Figure 3B:
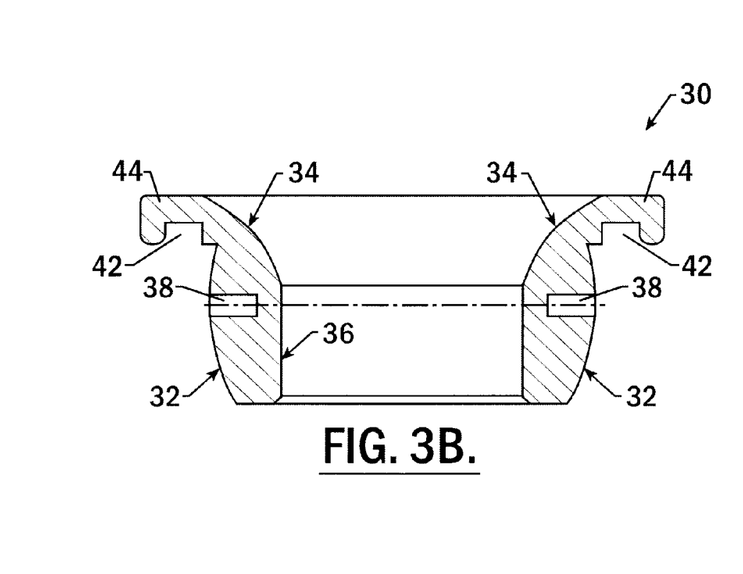

As shown in the perspective view of FIG. 1 and the plan and-cross-sectional view of FIGS. 3A and 3B, the chuck insert 30 is typically cast or machined of a suitably hard and tough metal, such as steel or aluminum, capable of withstanding the forces exerted upon it by a conical end portion of an ingot (not shown in FIG. 1). The chuck insert is received within the opening of the base 20 and serves as the ball in a ball and socket joint relationship with the base. The chuck insert defines a convex support surface 34 that is typically curved outward and an inner surface 36 that is generally parallel with the central axis 60 of the of the chuck 10. Additionally, the chuck insert includes a lip portion 44 that extends around the outer circumference of the chuck insert and defines a groove 42 disposed in the underside of the lip for the purpose of confining the seal 40. The support surface 34 is typically curved outward (as shown in the cross-sectional view of FIG. 3B) so that it can accommodate and support conical end portions of ingots having varying diameters and varying conical shapes. As shown in the plan view illustration of FIG. 3A, the support surface is a continuous surface that is not interrupted by fastener holes that would tend to engage protruding nodes existing on the surface of the ingots. The outwardly curved nature of the support surface also limits the contact area between the conical end portion of the ingot and the support surface. By limiting the contact area the frictional forces between the ingot and the support surface are lessened, making it possible to properly align the ingot during the loading process. Additionally, limiting the contact area also minimizes the possibility that protruding nodes on the surface of the conical end portion will be present in the contact area.

Figure 4:
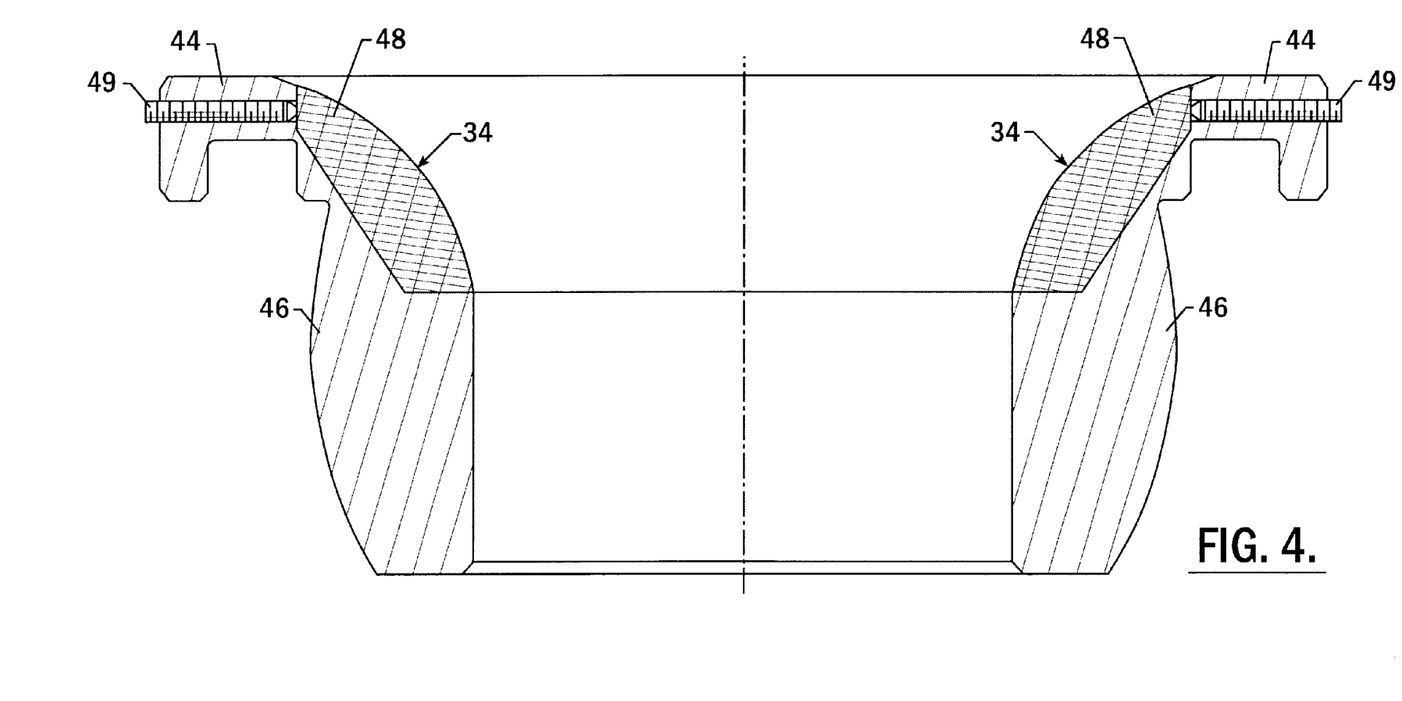
FIG. 4 is a cross-sectional view of a two-piece chuck insert having an outer bowl and an inner insert, in accordance with an embodiment of the present invention.
Figure 5A:
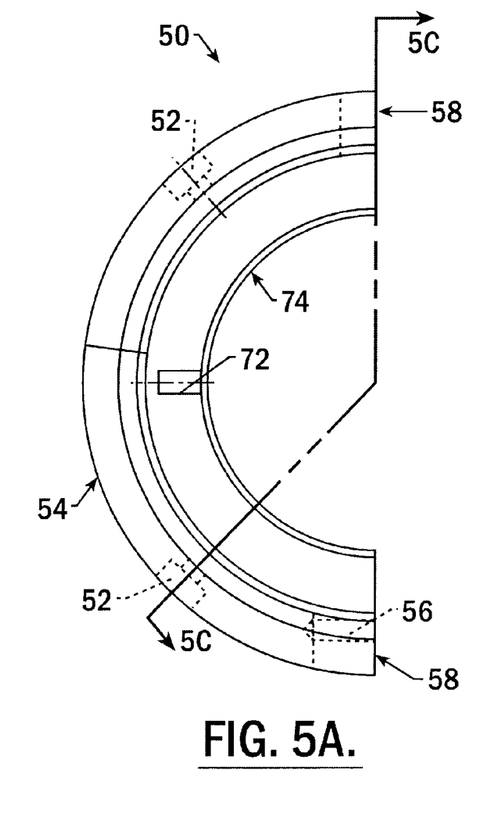
FIGS. 5A–5C are plan, side and cross-sectional views of a retainer of the multi-piece swivel chuck, in accordance with an embodiment of the present invention.
Figure 5B:
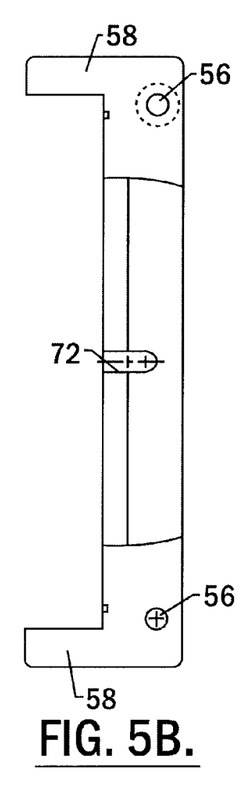
Figure 5C:
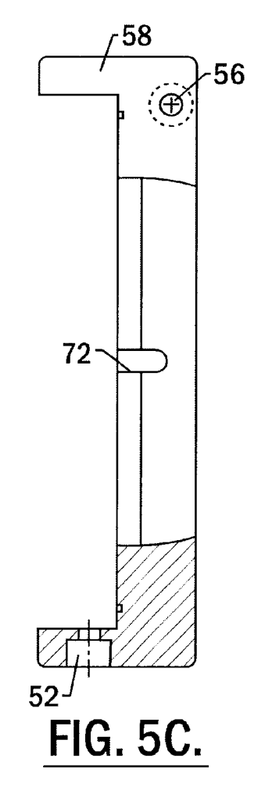

It is also possible, and within the inventive concepts herein disclosed, to provide for a two-piece chuck insert. A cross-sectional view of a two-piece chuck insert 30 is shown in FIG. 4. A two-piece chuck allows for a damaged or exhausted support surface to be easily replaced without the need to remove the retainer 50 (not shown in FIG. 4) The chuck insert comprises an outer bowl 46 that serves as the ball in the ball and socket joint and an inner insert 48 that incorporates the support surface 34. The inner insert is secured within a recessed area of the outer bowl by setscrews 49 that are inserted into holes located about the outer lip 44 of the outer bowl. The use of setscrews to secure the inner insert to the outer bowl is shown by way of example, other fasteners may also be used to secure the inner insert to the outer bowl. The use of the two-piece chuck insert embodiment allows for the support surface to be readily changed out, thus minimizing lathe downtime and adding overall efficiency to the process. Additionally, by only requiring the inner insert to be replaced fabrication costs and material costs are minimized.

The seal 40 is typically formed from a polymeric material, such as rubber. The seal is an o-ring shaped piece that is fabricated so that it fits in a groove 42 located along the underside of the lip portion 44 of the chuck insert 30. The seal is an optional part that provides the chuck with protection from general wear and tear and prevents the chuck from having cutting fluids enter into the chuck's moving parts. Additionally, the spring-like nature of the seal allows the chuck insert to rotate back to a center position when the ingot is removed from the chuck. Chucks of the present invention that do not provide for the seal will have a tendency to wear more quickly, require more frequent maintenance and will not re-center automatically after ingot removal.

The retainer 50 is typically a two-piece unit that is machined or cast of a hard metal, such as aluminum or steel. The retainer serves to hold the chuck insert 30 in place while allowing for the chuck insert to pivot accordingly. The pivoting of the chuck insert permits the ingots to be properly aligned in the lathe and lessens the effects of friction upon the mating of the conical end portion of the ingot and the contact surface of the chuck insert. The retainer will typically include a series of first holes 52 disposed about the outer surface 54 of the retainer that receive fasteners, typically bolts, for attaching the retainer to the base 20 via the retainer holes 24. Additionally, the retainer will typically comprise a series of second holes 56 disposed about the interior mating surface 58 of the retainer that receive fasteners, typically bolts or pegs, for joining and attaching the two-piece retainer unit. In operation, the retainer can be disassembled in an efficient manner, allowing for the chuck inserts to be readily changed out if the chuck insert becomes damaged or exhausted. Thus, this configuration of the chuck, in accordance with the present invention, provides for a simplistic means of replacing chucks without incurring costly lathe downtime.

Additionally, as shown in FIG. 1, the chuck may comprise insert pins 70 that may be fabricated from a metal material or any other suitable material. As depicted in FIG. 1 and FIGS. 3A and 3B, the insert pins are received in the insert pin holes 38 located on the exterior surface 32 of the chuck insert 30. Typically, two insert pin holes will generally be disposed about 180 degrees opposite one another on the base insert. As illustrated in FIG. 1 and FIGS 5A–5C, the insert pins are also received in insert pin slots 72 disposed on the arcuate interior surface 74 of the retainer 50. The pin slots serve to impede the motion of the pins, thus, preventing the chuck insert from rotating freely in the base, but still allowing the base insert to pivot (i.e. rock back and forth). It is also possible to provide for only one insert pin and corresponding insert pin hole and insert pin slot. The quantity and size of the insert pins, as well as the material chosen to form the pins, are functions of the load that they need to bear in supporting the chuck insert.

The pivoting nature of the chuck insert allows the ingot to properly align, generally parallel with the lathe, during the ingot loading process. The ball shaped exterior surface of the chuck insert allows for the chuck insert to pivot throughout 360 degrees of motion. The pivoting motion allows the ingot to overcome the frictional force that exists between the contact surface of the chuck and the ingot. In operation once the ingot has been properly positioned in the opposing end chuck inserts (i.e. at the headstock and tailstock), the forces exerted on the chuck balance out and the ingot becomes properly aligned in the desired lathe axis.

Figure 6:
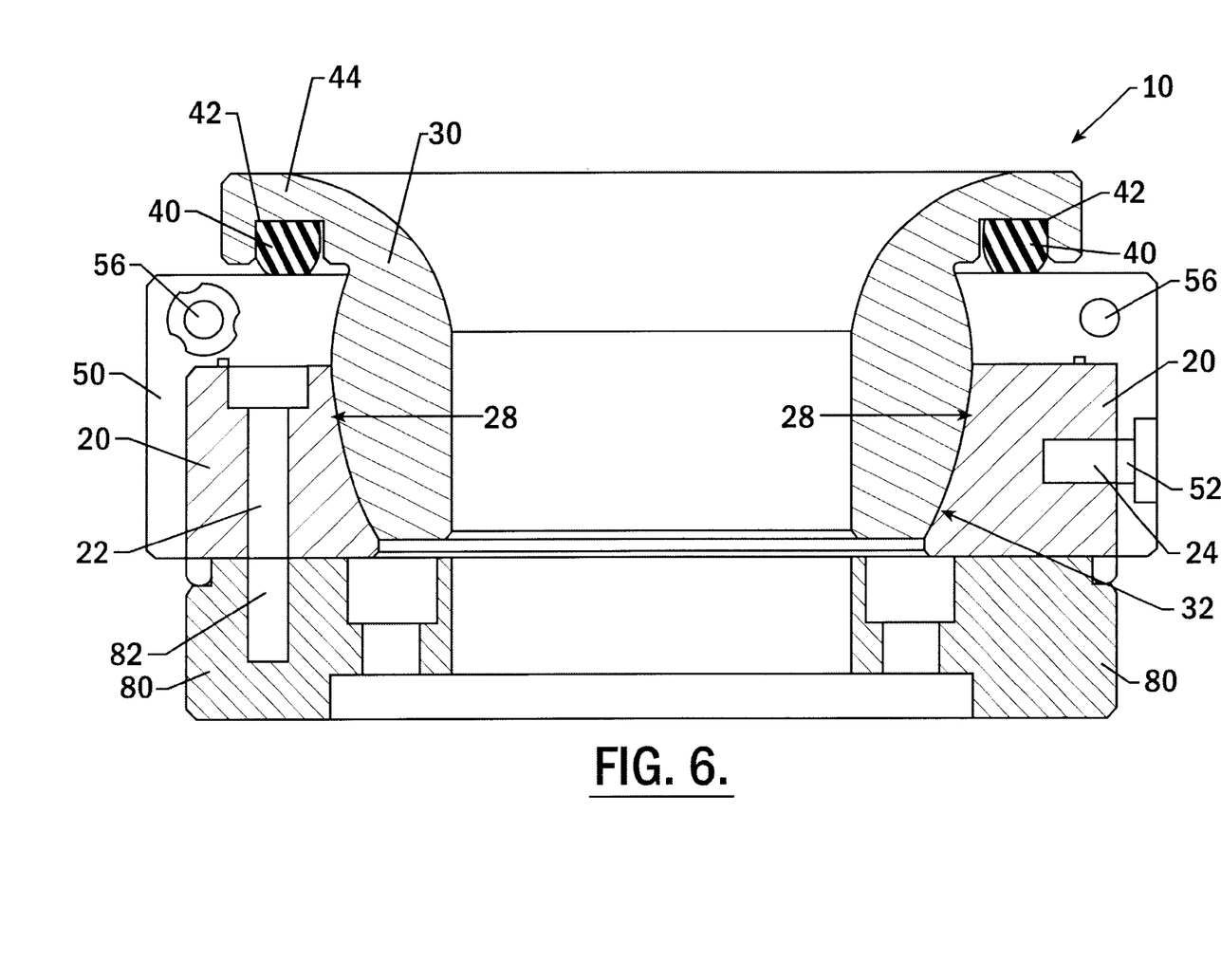
FIG. 6 is a cross-sectional view of an assembled multi-piece swivel chuck, in accordance with an embodiment of the present invention.

FIG. 6 is a cross sectional illustration of a multi-piece swivel chuck 10 in accordance with an embodiment of the present invention. In application, identical multi-piece swivel chucks would be disposed on opposite ends of the lathe (i.e. headstock and tailstock) for securing the elongated single crystal ingot. The base 20 is fastened to the drive plate 80 by suitable fasteners, such as bolts, that extend through the fastener holes 22 in the base and mate with similar holes 82 in the drive plate. The seal 40 is disposed within the groove 42 located along the underside of the lip of the chuck insert 30. The chuck insert and adjoining seal are inserted into the center cavity of the base. As shown the concave, cup-like, inner surface 28 of the base mates with the convex, ball-like, exterior surface 32 of the chuck insert 30. Although not shown in FIG. 6, a small predetermined gap will exist between the inner surface of the base and the exterior surface of the chuck insert to allow for the pivoting motion to occur. When the ingot is placed into the chuck and properly clamped into place, the gap between the inner surface of the base and the exterior surface of the chuck insert will approach zero. The retainer 50 secures the chuck insert to the base by inserting fasteners in the series of first holes 52 in the retainer that connect with retainer holes 24 in the base. The series of second holes 56 in the base receive fasteners that are used to connect the individual retainer halves so as to surround and retain the entirety of the chuck insert. Additionally, a lubricant is typically applied to the mating surfaces of the chuck to prevent water from entering the chuck and to allow for ease of pivot motion of the chuck insert.

The resulting multi-piece swivel chuck of the present invention provides for a chuck that pivots so that frictional forces between the chuck and the work piece are overcome and, thus, proper alignment of the work piece is facilitated. Additionally, the chuck of the present invention has a characteristically smooth, continuous support surface, devoid of fastener holes. This feature allows a conical end portion of the work piece to mate with the chuck without nodules on the work piece engaging holes in the support surface. The multi-piece configuration of the invention allows for damaged or exhausted chuck inserts to be readily replaced with minimal lathe downtime, thus increasing overall processing efficiency.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A chuck for receiving and supporting an end of a work piece during a process of shaping an exterior surface of the work piece, the chuck comprising:

a base having an opening defining a central axis therethrough and further defining at least one lathe-fastener aperture for securing the base to a lathe;

a chuck insert that is adapted to be partially received within the opening of the base and defining a work piece support surface that is coaxial with the central axis when the chuck insert is disposed in a nominal position within the opening of the base; and a retainer that is secured to the base, adapted to surround at least a portion of the chuck insert and support the chuck insert such that the chuck insert is capable of pivoting from the nominal position to a predetermined angle relative to the central axis when the conical end of the work piece is loaded into the chuck so as to align the work piece within the lathe.

2. The chuck of claim 1, further comprising a seal that is disposed between the chuck insert and the retainer.

3. The chuck of claim 1, further comprising at least one insert pin disposed within at least one insert pin aperture defined by the chuck insert and received within at least one insert pin slot defined by the retainer, wherein the insert pin prevents the chuck insert from rotating freely about the central axis while allowing the chuck insert to pivot from the nominal position to a limited predetermined angle relative to the central axis.

4. The chuck of claim 1, wherein the base further defines at least one retainer-fastener aperture for receiving respective fasteners for securing the retainer to the base.

5. The chuck of claim 1, wherein the retainer further comprises a two-piece unit that surrounds the chuck insert in ring-like fashion.

6. The chuck of claim 5, wherein the retainer further defines a plurality of retainer-joining apertures for receiving fasteners to attach the two-piece unit into a ring-like unit that surrounds a portion of the chuck insert.

7. The chuck of claim 1, wherein the chuck insert further defines an outer bowl and an inner insert, wherein the inner insert defines the work piece support surface and the inner insert is received and secured within the outer bowl.

8. The chuck of claim 1, wherein the work piece support surface of the chuck insert is a continuous, uninterrupted surface.

9. The chuck of claim 1, wherein the work piece support surface is an arcuate, convex support surface capable of supporting the conical end portion of work pieces having varying diameters.

10. A chuck for receiving and supporting a conical shaped end of a single crystal ingot during a process of shaping an exterior surface of the ingot, the chuck comprising:

a base having an opening defining a central axis therethrough and further defining at least one lathe-fastener aperture for securing the base to a lathe;

a chuck insert that is adapted to be partially received within the opening of the base and defines a conical ingot support surface that is coaxial with the central axis when the chuck insert is disposed in a nominal position within the opening of the base and a lip portion that extends around the periphery of the chuck insert and defines a groove within the underside of the lip portion;

a retainer that is secured to the base, adapted to surround at least a portion of the chuck insert and support the chuck insert such that the chuck insert is capable of pivoting from the nominal position to a predetermined angle relative to the central axis when the conical end of the work piece is loaded into the chuck so as to align the work piece within the lathe; and a seal that is disposed within the groove of the lip portion of the chuck insert so as to provide for an interface between the chuck insert and the retainer.

11. The chuck of claim 10, further comprising at least one insert pin disposed within at least one insert pin aperture defined by the chuck insert and received within at least one insert pin slot defined by the retainer, wherein the insert pin prevents the chuck insert from rotating about the central axis while allowing the chuck insert to pivot from the nominal position to a limited predetermined angle relative to the central axis.

12. The chuck of claim 10, wherein the retainer further comprises a two-piece unit that surrounds and supports the chuck insert in ring-like fashion.

13. The chuck of claim 12, wherein the retainer further defines a plurality of retainer-joining apertures for receiving fasteners to attach the two-piece unit into a ring-like unit.

14. The chuck insert of claim 10, wherein the chuck insert further defines an outer bowl and an inner insert, wherein the inner insert defines the conical ingot support surface and the inner insert is received and secured within the outer bowl.

15. The chuck of claim 10, wherein the conical ingot support surface of the chuck insert is a continuous, uninterrupted surface.

16. A chuck for receiving and supporting an end of a work piece during a process of shaping an exterior surface of the work piece, the chuck comprising:
   a base having an opening defining a central axis therethrough and further defining at least one lathe-fastener aperture for securing the base to a lathe;
   a chuck insert that is adapted to be partially received within the opening of the base and defining convex work piece support surface that is coaxial with the central axis when the chuck insert is disposed in a nominal position within the opening of the base; and
   a retainer that is adapted to surround and support at least a portion of the chuck insert and defining at least one base-fastener aperture for receiving respective fasteners for securing the retainer to the base.

17. The chuck of claim 16, wherein the chuck further comprises a pivoting means for allowing the chuck insert to pivot from the nominal position to a predetermined angle relative to the central axis when the conical end of the work piece is loaded into the chuck so as to align the work piece within the lathe.

18. The chuck of claim 16, further comprising a seal that is disposed between the chuck insert and the retainer.

19. The chuck of claim 16, further comprising at least one insert pin disposed within at least one insert pin aperture defined by the chuck insert and received within at least one insert pin slot defined by the retainer, wherein the insert pin prevents the chuck insert from rotating about the central axis while allowing the chuck insert to pivot from the nominal position to a limited predetermined angle relative to the central axis.

20. The chuck of claim 16, wherein the chuck insert further comprises an outer bowl and an inner insert, wherein the inner insert defines the convex work piece support surface and the inner insert is received and secured within the outer bowl.

* * * * *

UNITED STATES PATENT AND TRADEMARK OFFICE
CERTIFICATE OF CORRECTION

PATENT NO. : 6,497,765 B1
DATED : December 24, 2002
INVENTOR(S) : Nice

It is certified that error appears in the above-identified patent and that said Letters Patent is hereby corrected as shown below:

<u>Title page,</u>
Item [56], References Cited, insert the following:

-- FOREIGN PATENT DOCUMENTS
  JP    7-48, 138*    2/1995 --.

Signed and Sealed this

Twentieth Day of May, 2003

JAMES E. ROGAN
*Director of the United States Patent and Trademark Office*